(12) United States Patent
Liu

(10) Patent No.: US 8,243,506 B2
(45) Date of Patent: Aug. 14, 2012

(54) PHASE CHANGE MEMORY STRUCTURES AND METHODS

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 12/869,338

(22) Filed: Aug. 26, 2010

(65) Prior Publication Data

US 2012/0051123 A1 Mar. 1, 2012

(51) Int. Cl.
*G11C 11/00* (2006.01)
*H01L 29/02* (2006.01)

(52) U.S. Cl. ............... 365/163; 365/148; 257/2; 257/4

(58) Field of Classification Search ............... 365/163
See application file for complete search history.

(56) References Cited

U.S. PATENT DOCUMENTS

| | | | |
|---|---|---|---|
| 6,545,287 B2 * | 4/2003 | Chiang | 257/3 |
| 6,815,704 B1 * | 11/2004 | Chen | 257/2 |
| 6,869,883 B2 * | 3/2005 | Chiang et al. | 438/700 |
| 7,307,269 B2 | 12/2007 | Kim et al. | |
| 7,348,590 B2 * | 3/2008 | Happ | 257/4 |
| 7,655,940 B2 | 2/2010 | Park et al. | |
| 7,671,355 B2 * | 3/2010 | Kuo et al. | 257/3 |
| 7,709,822 B2 * | 5/2010 | Karpov et al. | 257/4 |
| 7,915,602 B2 * | 3/2011 | Sato | 257/4 |
| 8,026,173 B2 * | 9/2011 | Karpov et al. | 438/639 |
| 8,053,750 B2 * | 11/2011 | Chang | 257/2 |
| 2005/0029504 A1 * | 2/2005 | Karpov | 257/4 |
| 2008/0054244 A1 | 3/2008 | Lee et al. | |
| 2008/0128676 A1 | 6/2008 | Lee et al. | |
| 2009/0026437 A1 * | 1/2009 | Kim et al. | 257/4 |
| 2009/0039331 A1 * | 2/2009 | Clevenger et al. | 257/4 |
| 2009/0107290 A1 | 4/2009 | Rosocha et al. | |
| 2009/0220744 A1 * | 9/2009 | Martinez et al. | 428/156 |
| 2010/0096609 A1 | 4/2010 | Kim et al. | |
| 2010/0117046 A1 | 5/2010 | Chang et al. | |
| 2011/0001114 A1 * | 1/2011 | Zanderighi et al. | 257/4 |

FOREIGN PATENT DOCUMENTS

EP 0798779 A1 4/1997
KR 10-0190060 B1 1/1999

OTHER PUBLICATIONS

Y. Matsui, et al. "Ta2o5 Interfacial Layer Between GST and W Plug Enabling Low Power Operation of Phase Change Memories". IEEE 2006. (4 pgs.).
C. Hoglund, et al. "Topotaxial Growth of Ti2AlN by solid state reaction in AlN/Ti(0001) multilayer thin films". Applied Physics Letters 90, 174106 (2007). (3 pgs.). V.P. Godbole, et al. "Thermal reactions and micro-structure of TiN-AlN layered nano-composites". Materials Seicnce and Engineering B68 (1999) 85-90. (6 pgs.).
El-Sayed, et al, "Interfacial Structure and Reaction Mechanism of AlN/Ti Joints," Journal of Materials Science, 1997, vol. 32, No. 10, pp. 2715-2721.
International Search Report and Written Opinion for related PCT Application No. PCT/US2011/001437, mailed Mar. 17, 2012 (7 pgs.).

* cited by examiner

*Primary Examiner* — Son Mai
(74) *Attorney, Agent, or Firm* — Brooks, Cameron & Huebsch, PLLC

(57) ABSTRACT

Methods, devices, and systems associated with phase change memory structures are described herein. One method of forming a phase change memory structure includes forming an insulator material on a first conductive element and on a dielectric material of a phase change memory cell, forming a heater self-aligned with the first conductive element, forming a phase change material on the heater and at least a portion of the insulator material formed on the dielectric material, and forming a second conductive element of the phase change memory cell on the phase change material.

25 Claims, 5 Drawing Sheets

US 8,243,506 B2

PHASE CHANGE MEMORY STRUCTURES AND METHODS

TECHNICAL FIELD

The present disclosure relates generally to semiconductor memory devices and methods, and more particularly, to phase change memory structures and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among other types of memory.

Resistance variable memory devices, such as PCRAM devices, can include a structural phase change material such as a chalcogenide alloy, for instance, which can be programmed into different resistivity states to store data. The phase change memory cells are nonvolatile and the particular data stored in a phase change memory cell can be read by sensing the cell's resistance (e.g., by sensing current and/or voltage variations based on the resistance of the phase change material).

In cases in which the resistance variable memory device includes a chalcogenide alloy, the chalcogenide alloy can exhibit a reversible structural phase change (e.g., from amorphous to crystalline). A small volume of the chalcogenide alloy can be integrated into a circuit that can allow the cell to act as a fast switching programmable resistor. This programmable resistor can exhibit greater than 40 times the dynamic range of resistivity between the crystalline state (low resistivity) and the amorphous state (high resistivity), and is also capable of exhibiting multiple intermediate states that allow multi-bit storage in each cell. That is, resistance variable memories may achieve multi-level cell (MLC) functionality via programming of memory cells to one of a number of different resistance levels.

The reliability of phase change memory cells over time can be affected by various factors such as the adhesion between the phase change material and underlying substrate and/or the current densities used to provide sufficient power to melt the phase change material, among other factors. As an example, large current density can cause undesired electro-migration in conductive materials of a phase change memory cell and may cause phase separation in the phase change material, in some instances.

DETAILED DESCRIPTION

Figure 1:
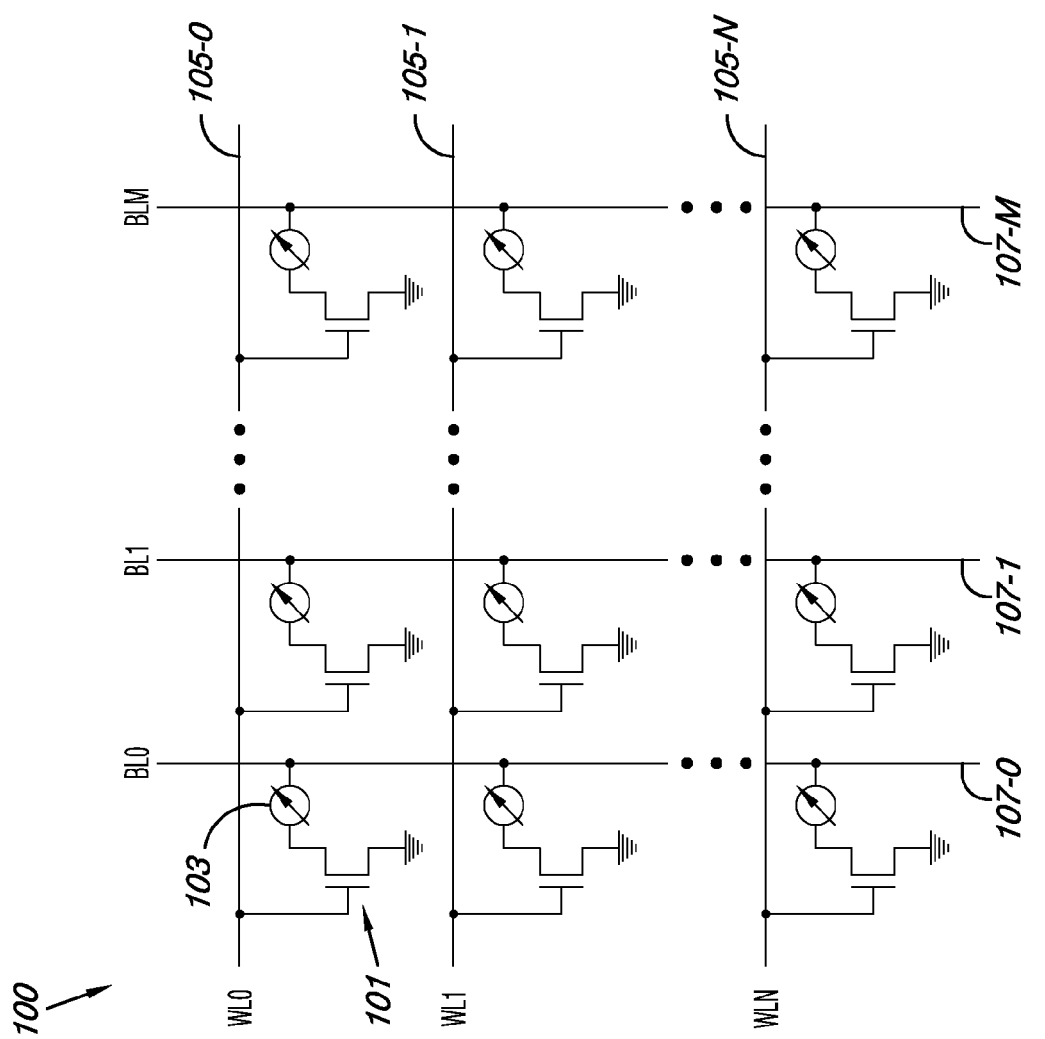
FIG. 1 is a schematic of a portion of a phase change memory array having one or more phase change memory structures in accordance with one or more embodiments of the present disclosure.

Methods, devices, and systems associated with phase change memory structures have been described. One method of forming a phase change memory structure includes forming an insulator material on a first conductive element and on a dielectric material of a phase change memory cell, forming a heater self-aligned with the first conductive element, forming a phase change material on the heater and at least a portion of the insulator material formed on the dielectric material, and forming a second conductive element of the phase change memory cell on the phase change material.

Embodiments of the present disclosure can provide various benefits such as providing improved adhesion between a phase change material and the underlying substrate and reducing the programming current density associated with phase change memory cells, as compared to previous phase change memory cells. Reducing the programming current density can increase the reliability of phase change memory cells, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 101 may reference element "01" in FIG. 1, and a similar element may be referenced as 401 in FIG. 4. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

As used in this disclosure, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or, junctions in the base semiconductor structure or foundation.

FIG. 1 is a schematic of a portion of a phase change memory array 100 having one or more phase change memory structures in accordance with one or more embodiments of the present disclosure. In the embodiment illustrated in FIG. 1, the memory array 100 includes a number of phase change memory cells each having an associated access device 101 and resistance variable element 103 (e.g., a phase change material 103). The access devices 101 can be operated (e.g., turned on/off) to access the memory cells in order to perform operations such as data programming (e.g., writing) and/or data sensing (e.g., reading) operations on the resistance variable elements 103.

In the embodiment illustrated in FIG. 1, the access devices 101 are metal oxide semiconductor field effect transistors (MOSFETs). As shown in FIG. 1, a gate of each MOSFET 101 associated with each memory cell is coupled to one of a number of access lines 105-0 (WL0), 105-1 (WL1), . . . , 105-N (WLN) (i.e., each access line 105-0, 105-1, . . . , 105-N is coupled to a row of phase change memory cells). The access lines 105-0, 105-1, . . . , 105-N may be referred to herein as "word lines." The designator "N" is used to indicate that a memory array can include a number of word lines.

The resistance variable elements 103 can be a phase change chalcogenide alloy such as a Germanium-Antimony-Tellurium (GST) material (e.g., a Ge—Sb—Te material such as $Ge_2Sb_2Te_5$, $Ge_2Sb_2Te_7$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include Ge—Te, Sb—Te, Ge—Sb, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In the embodiment illustrated in FIG. 1, each resistance variable element 103 is coupled to one of a number of data lines 107-0 (BL0), 107-1 (BL1), . . . , 107-M (BLM) (i.e., each data line 107-0, 107-1, . . . , 107-M is coupled to a column of phase change memory cells). The data lines 107-0, 107-1, . . . , 107-M may be referred to herein as "bit lines" or "sense lines." The designator "M" is used to indicate that a memory array can include a number of bit lines. For ease of addressing in the digital environment, the number of word lines 105-1, . . . , 105-N and the number of bit lines 107-1, . . . , 107-M can each be some power of two(e.g., 256 word lines by 4,096 bit lines). However, embodiments are not limited to particular numbers of word lines and/or bit lines.

In operation, appropriate voltage and/or current signals (e.g., pulses) can be applied to the bit lines 107-0, 107-1, . . . , 107-M and word lines 105-0, 105-1, . . . , 105-N in order to program data to and/or read data from the phase change memory cells of the array 100. As an example, the data stored by a phase change memory cell of array 100 can be determined by turning on an access device 101 and sensing a current passing through the phase change element 103. The current sensed on the bit line associated with the memory cell being read corresponds to a resistance level of the phase change element 103, which in turn corresponds to a particular data value (e.g., a binary value such as 1, 0, 001, 111, 1011, etc.)

Embodiments of the present disclosure are not limited to the example array 100 illustrated in FIG. 1. For example, the access device 101 associated with a particular memory cell can be a device other than a MOSFET. In some embodiments, the access device 101 can be a bipolar junction transistor (BJT) or a diode (e.g., p-n diode, a Schottky diode, or a Zener diode), among other types of access devices. Although not illustrated in FIG. 1, one of ordinary skill in the art will appreciate that the phase change memory array 100 can be coupled to other memory components including a controller and various write/read circuitry and/or other control circuitry.

FIGS. 2A-2D are cross-sectional views illustrating formation of a phase change memory structure in accordance with one or more embodiments of the present disclosure. The memory cell structure shown in FIGS. 2A-2D includes a base semiconductor structure that includes a substrate 202 including a conductive contact 206 formed in a dielectric material 204. The substrate 202 can be a silicon substrate, silicon on insulator (SOI) substrate, or silicon on sapphire (SOS) substrate, among others. The dielectric material 204 can be a nitride or oxide such as silicon dioxide ($SiO_2$) or silicon nitride (SiN), among other dielectric materials. The conductive contact 206 can be made of a metal (as shown in FIGS. 2A-2D) such as tungsten (W) or other suitable conductive material and can be formed in the dielectric material 204 via a masking and etching process, for instance. Although not shown in FIGS. 2A-2D, the contact 206 can be coupled to an access device (e.g., an access transistor) corresponding to a particular memory cell (e.g., a PCRAM cell such as shown in FIG. 1).

The structure shown in FIGS. 2A-2D includes a first conductive element 208 (e.g., a first electrode) formed on the conductive contact 206. The first conductive element 208 can be a bottom electrode (BE) 208. The bottom electrode 208 can be a conductive material such as titanium (Ti), titanium nitride (TiN) (e.g., titanium rich TiN), tantalum (Ta), and/or tantalum nitride (TaN), for example. The bottom electrode 208 can be formed by masking and etching, among other suitable processes. One or more side surfaces of the bottom electrode 208 are in contact with the dielectric material 204.

Figure 2A:
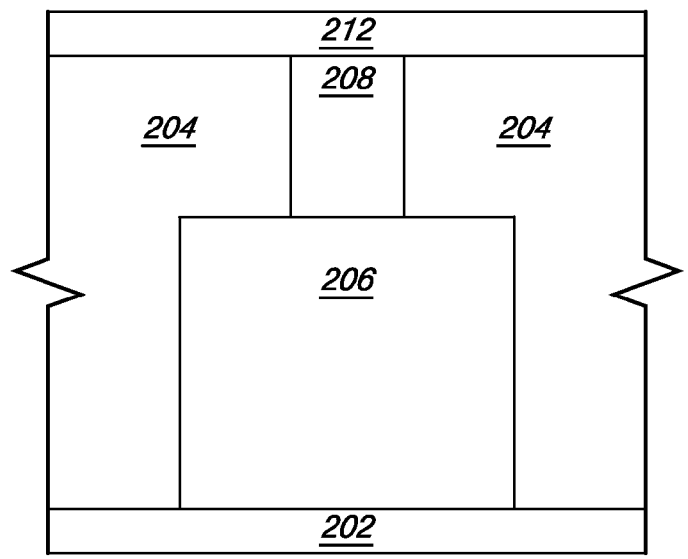
FIGS. 2A-2D are cross-sectional views illustrating formation of a phase change memory structure in accordance with one or more embodiments of the present disclosure.

As illustrated in FIG. 2A, forming a phase change memory structure in accordance with one or more embodiments of the present disclosure includes forming an insulator material 212 on the bottom electrode 208 and the dielectric material 204. In one or more embodiments, an upper surface of the dielectric material 204 and/or the bottom electrode 208 can be planarized via chemical mechanical planarization (CMP) or other suitable processes prior to forming the insulator material 212 thereon.

The insulator material 212 can be a material such as aluminum nitride (AlN) or silicon nitride (SiN), for example, and can provide an adhesive interface between the dielectric material 204 and a phase change material, such as phase change material 216 described in connection with FIGS. 2C-2D. That is, the adhesion between the insulator material 212 and a phase change material formed thereon is greater than the adhesion between the dielectric material 204 and the phase change material formed thereon, in various embodiments. As such, the insulator 212 can be referred to as an insulative adhesion material. Improved adhesion between a phase change material and the underlying substrate can provide benefits such as increasing the long term reliability of a phase change memory device, among other benefits.

The insulator material 212 can have a thickness of between about 2 nm-3 nm; however, embodiments are not limited to a particular thickness. For instance, in some embodiments, the thickness of the insulator material 212 is not more than about 10 nm. However, the thickness of the insulator 212 can be less than about 2 nm or greater than about 10 nm, in various embodiments.

Figure 2B:
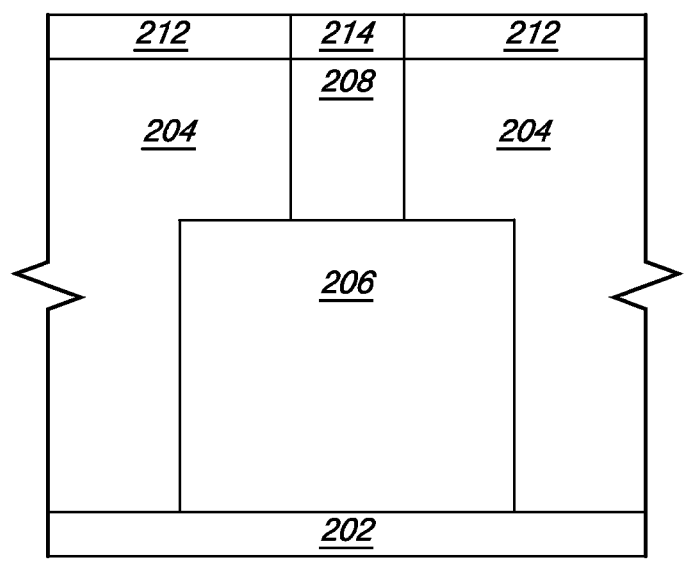

FIG. 2B illustrates an interfacial heater 214. In various embodiments, the heater 214 is self-aligned with the bottom electrode 208. The heater 214 can be formed, for example, by modifying a portion of the insulator material 212 (e.g., a portion of material 212 formed on the bottom electrode 208).

In one or more embodiments, modifying the insulator material 212 to form the self-aligned heater 214 includes creating a reaction between the insulator material 212 and the bottom electrode material 208 such that the heater 214 is a different material than the insulator 212. As an example, the reaction can be created by heating the bottom electrode 208 and/or the insulator material 212 formed thereon.

For instance, the memory structure illustrated in FIG. 2A can be heated via a thermal anneal process such as a rapid thermal annealing (RTA), laser annealing, or a microwave heating process, among other heating processes. Such a process can promote a solid-state reaction between the insulator material 212 and the bottom electrode 208.

As one example, the bottom electrode 208 can be a titanium nitride (TiN) material and the insulator material 212 can be an aluminum nitride (AlN) material. In such an embodiment, a thermal anneal process (e.g., in $N_2$ at about 500° C. for about 5 minutes) can form epitaxial titanium aluminum nitride (e.g., $Ti_2AlN$) as the heater 214. In some embodiments, thermal reaction of a TiN bottom electrode 208 with an AlN insulator 212 can form heaters 214 having other TiAlN alloy phases such as $Ti_3Al_2N_2$ and $Ti_3AlN$, for instance.

As another example, the bottom electrode 208 can be a titanium (Ti) electrode and the insulator material 212 can be AlN. Since the Ti bottom electrode 208 may oxidize (e.g., after a CMP process performed on the surface of the bottom electrode 208), further processing may be used to reduce the titanium oxide (TiOx) to Ti prior to the heating process used to modify the insulator material 212. For instance, an in situ plasma treatment can be used to reduce at least a portion of the TiOx to titanium metal. As an example, the TiOx can be exposed to a non-thermal plasma such as an electrical discharge plasma, a microwave-driven non-thermal plasma, a dielectric barrier plasma, a pulsed corona discharge plasma, a glow discharge plasma, and/or an atmospheric pressure plasma jet, among other non-thermal plasmas. The reduced Ti can then react with the AlN of the insulator material 212 to form $Ti_2AlN$ or other titanium aluminum nitride alloy phase.

As another example, the bottom electrode 208 can be a tantalum nitride (TaN) electrode and the insulator material 212 can be SiN. In such an embodiment, a thermal anneal process performed on the structure can form a tantalum silicon nitride (TaSiN) heater 214.

Figure 2C:
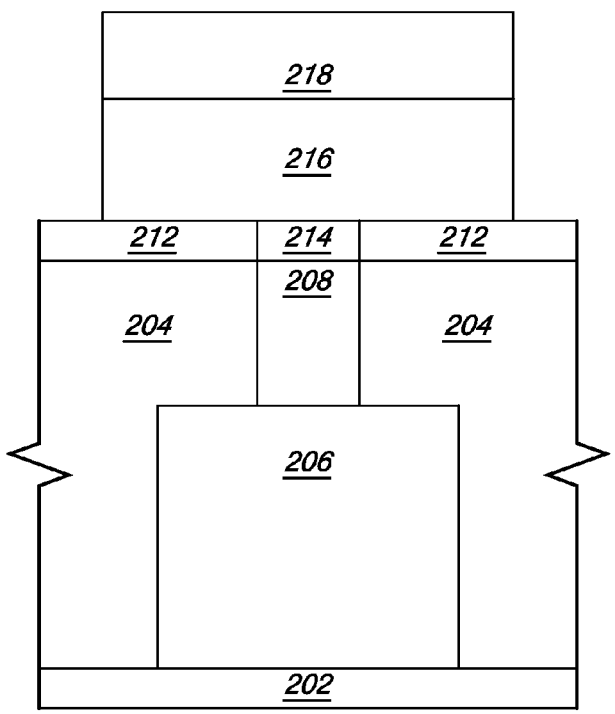

As illustrated in FIG. 2C, a phase change material 216 can be formed on the insulator material 212 and the bottom electrode 208, and a second conductive element 218 (e.g., a top electrode) can be formed on the phase change material 216. The top electrode 218 can be a bit line of a phase change memory cell or can be coupled to a bit line of the cell (e.g., via a contact plug).

Figure 2D:
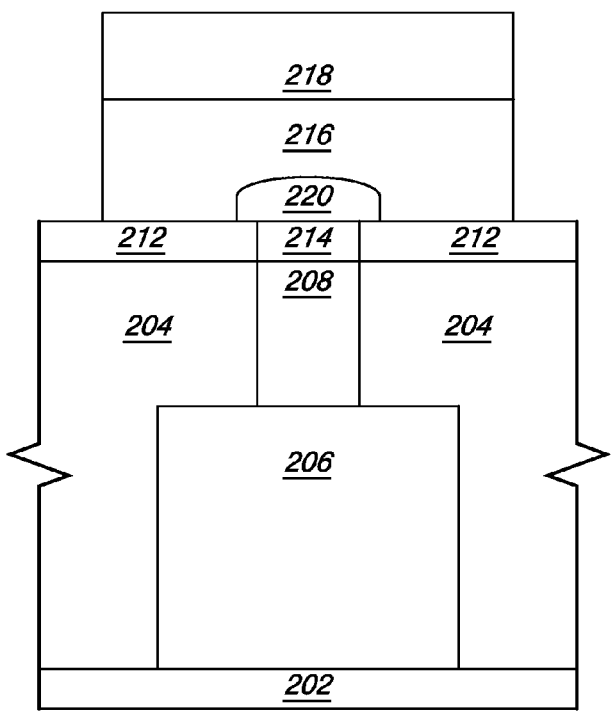

FIG. 2D illustrates an active region 220 of the phase change material 216. The active region 220 represents the portion of the phase change material 216 that changes phase (e.g., from crystalline to amorphous and vice versa) in response to heating due to current flow between the bottom electrode 208 and top electrode 218.

The self-aligned heater 214 at the interface between the bottom electrode 208 and the phase change material 216 provides various benefits. For instance, the heater 214 provides localized heat to the phase change material 216, which can assist with switching of the active region 220 and/or can reduce the current density required to induce switching as well as the power associated with operating the memory cell. The heater 214 has a low thermal conductivity compared to the bottom electrode 208, which reduces heat loss to the bottom electrode 208 (e.g., due to the heat sink effect). The heater 214 also has a high resistivity compared to the bottom electrode 208, such that the heater 214 can conduct current with a high temperature tolerance, which can increase the phase change memory cell integrity and/or reliability, for instance.

In some embodiments, the heater 214 can be formed via a masking and etching process. For example, a portion of the insulator material 212 (e.g., the portion formed on the bottom electrode 214) can be removed (e.g., via an etching process), and a material 214 (e.g., $Ti_2AlN$) can be deposited in its place. However, masking and etching to form the material 214 on the bottom electrode can include additional processing steps as compared to previous methods described above and do not provide self-alignment of the heater 214 with the bottom electrode 208.

As described below in connection with FIG. 4, the memory structure illustrated in FIG. 2D can be coupled to an access device (e.g., an access transistor) and other components and/or circuitry corresponding to a particular memory cell (e.g., a PCRAM cell such as shown in FIG. 1).

Figure 3:
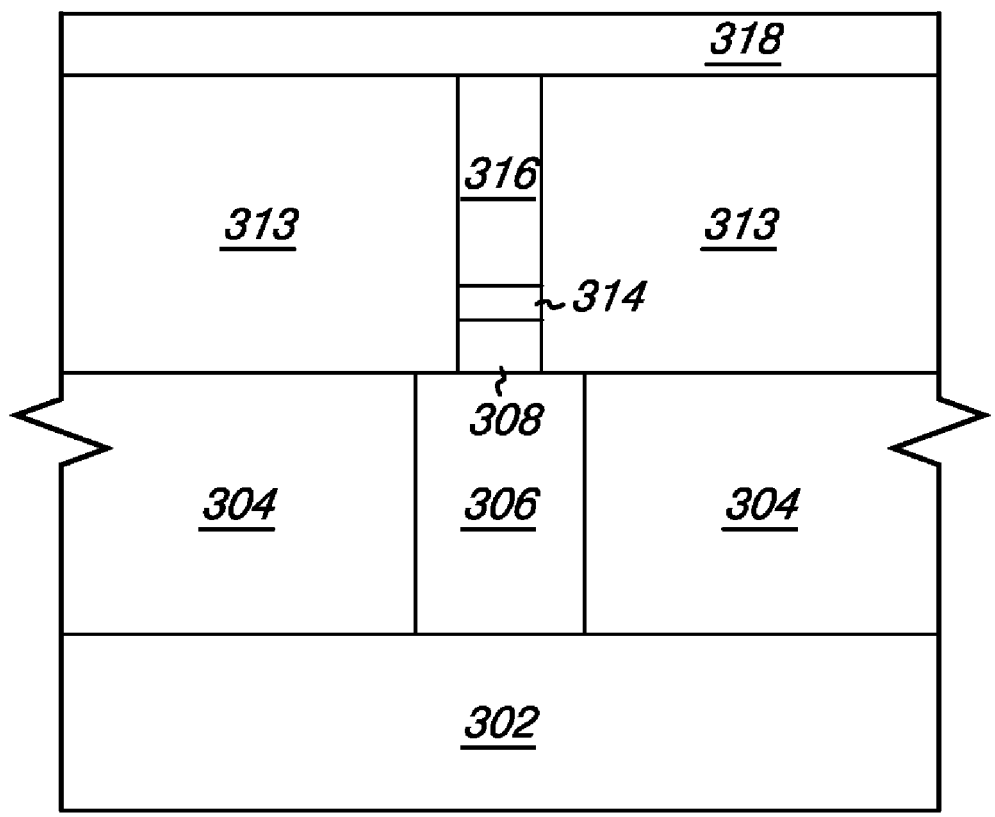
FIG. 3 illustrates a cross-sectional view of a portion of a phase change memory structure in accordance with one or more embodiments of the present disclosure.

FIG. 3 illustrates a cross-sectional view of a portion of a phase change memory structure in accordance with one or more embodiments of the present disclosure. The example shown in FIG. 3 is a confined phase change memory cell structure including a base semiconductor structure that includes a substrate 302 including a conductive contact 306 formed in a dielectric material 304. A dielectric material 313 is formed on the contact 306 and dielectric material 304. A via can be formed in the dielectric material 313 and a bottom electrode 308 can be deposited therein. A heater material 314 can be formed on the bottom electrode 308 and a phase change material 316 can be formed on the heater 314. The heater 314 can be formed by modifying an insulator material formed on the bottom electrode, as described above in connection with FIGS. 2A-2D. For instance, the heater 314 can be formed via a heating process such as a thermal anneal process, laser annealing process, or microwave heating process, for example. The phase change memory structure shown in FIG. 3 includes a top electrode 318 formed on the phase change material 316 and the dielectric material 313.

Figure 4:
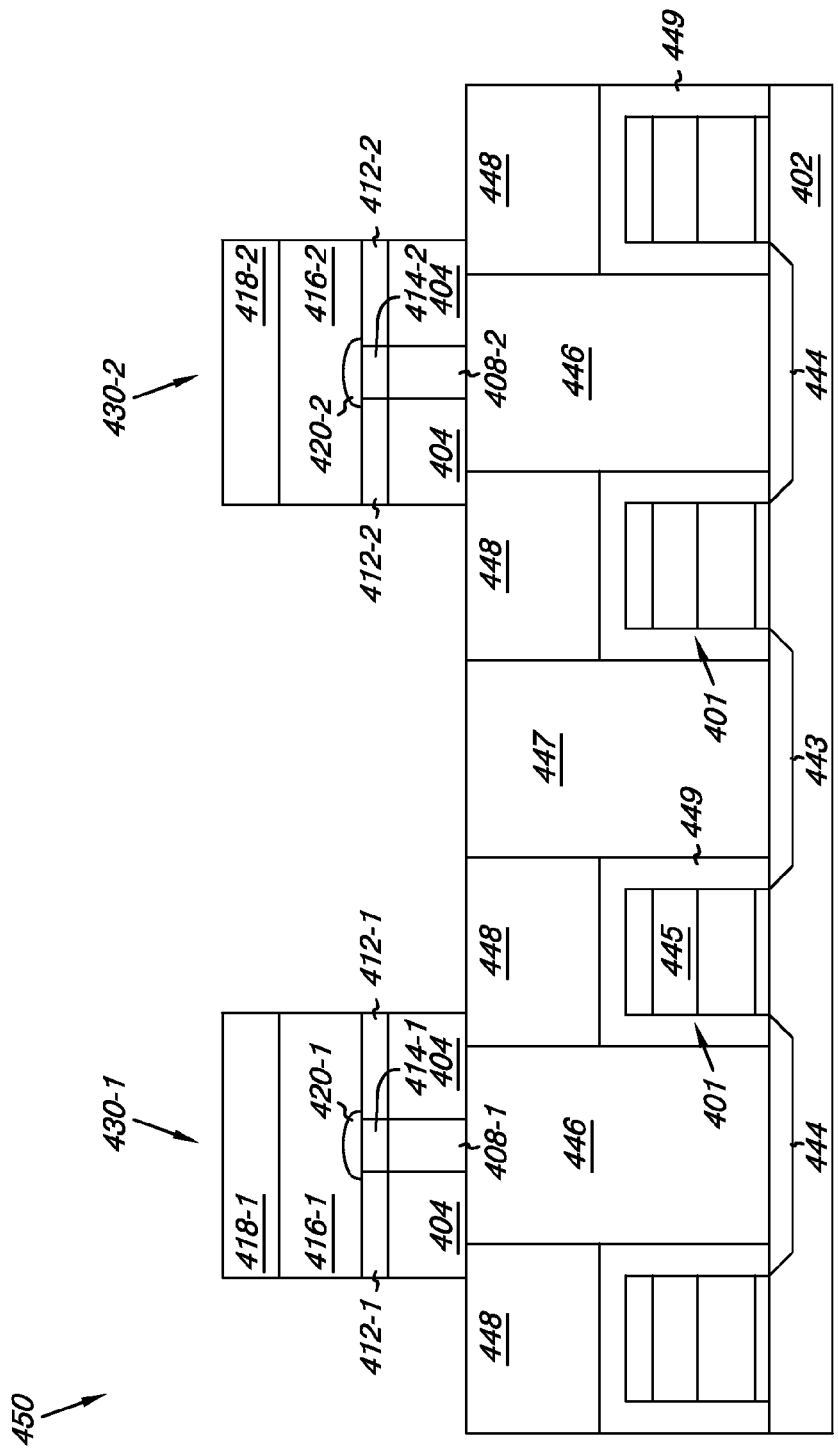
FIG. 4 is a cross-sectional view of a portion of a memory device in accordance with one or more embodiments of the present disclosure.

FIG. 4 is a cross-sectional view of a portion of a memory device 450 in accordance with one or more embodiments of the present disclosure. The memory device 450 includes a number of phase change memory cell structures formed in accordance with embodiments described herein. The example illustrated in FIG. 4 includes a first stack 430-1 and a second stack 430-2. The first stack 430-1 corresponds to a first phase change memory cell, and the second stack 430-2 corresponds to a second phase change memory cell (e.g., phase change memory cells such as those described in FIG. 1). The separate stacks 430-1 and 430-2 can be formed by a masking and etching process through the appropriate materials, for example.

Each of the stacks 430-1 and 430-2 includes a respective top electrode (TE) 418-1 and 418-2 formed on a respective phase change material (e.g., GST) 416-1 and 416-2. The phase change material 416-1 and 416-2 is formed on an insulator 412-1 and 412-2 as well as an interfacial heater 414-1 and 414-2 self-aligned with a respective bottom electrode 408-1 and 408-2.

The heaters 414-1 and 414-2 can be formed by modifying a portion of the insulator material 412-1 and 412-2, as described above in connection with FIGS. 2A-2D. For example, a heating process can be used to create a reaction between the bottom electrode (BE) material 408-1/408-2 (e.g., Ti as shown) and the insulator material 412-1/412-2 (e.g., AlN as shown) to form the interfacial heaters 414-1/414-2 (e.g., $Ti_2AlN$ as shown). The insulator material 412-1 and 412-2 can provide an adhesive interface between the phase change materials 416-1 and 416-2 and the underlying dielectric material 404 (e.g., $SiO_2$)

The bottom electrodes 408-1 and 408-2 are formed in the dielectric material 404, which is formed on respective conductive contacts 446. In this example, the contacts 446 are drain contacts. That is the contacts 446 couple the stacks 430-1 and 430-2 to a drain region 444 of a respective access device 401 (e.g., an access transistor). In this example, the access devices 401 are MOSFET (metal oxide semiconductor field effect transistor) devices having associated source 443, drain 444, and gate 445 regions and are formed on a base substrate 402. However, embodiments are not limited to a particular type of access device. For instance, as described above, the access devices 401 can be diodes or BJTs, among other types of access devices for operating phase change memory cells. As an example, the substrate 402 can be a p-type semiconductor substrate with n-type source 443 and drain 444 regions.

The phase change memory device 450 also includes a source contact 447 coupled to the source region 443 of one or more of the access devices 401. The source contact 447 and drain contacts 446 are formed in a dielectric material 448 (e.g., $SiO_2$) and a dielectric material 449 (e.g., SiN) is formed around the gate stacks of the transistors 401 to electrically insulate the transistors 401 from the contacts 446 and 447. Embodiments are not limited to particular dielectric materials 448 and 449.

As described above, phase change memory cell structures in accordance with embodiments described herein can provide various benefits. For instance, the self-aligned heaters 414-1 and 414-2 can provide localized heat to the active regions 420-1 and 420-2 of the memory cells, which can reduce the current required to induce structural phase transitions within the active regions. Reducing the current can reduce the power consumption associated with a memory device and can improve the long term reliability and/or integrity of the memory device. The adhesive insulator material 412-1 and 412-2 can improve adhesion between the phase change material 416-1 and 416-2 and the underlying substrate, as compared to previous approaches. Furthermore, modifying portions of the insulator material 412-1/412-2 via a heating process to form the self-aligned heaters 414-1/414-2 can provide various benefits without increasing the complexity of the fabrication processes.

Conclusion

Methods, devices, and systems associated with phase change memory structures have been described. One method of forming a phase change memory structure includes forming an insulator material on a first conductive element and on a dielectric material of a phase change memory cell, forming a heater self-aligned with the first conductive element, forming a phase change material on the heater and at least a portion of the insulator material formed on the dielectric material, and forming a second conductive element of the phase change memory cell on the phase change material.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a phase change memory structure, the method comprising:
    forming an insulator material on a first conductive element and on a dielectric material of a phase change memory cell;
    forming a heater self-aligned with the first conductive element;
    forming a phase change material on the heater and at least a portion of the insulator material formed on the dielectric material; and
    forming a second conductive element of the phase change memory cell on the phase change material;
    wherein forming the heater includes modifying a portion of the insulator material by heating the portion of the insulator material.

2. The method of claim 1, including forming the phase change material on the heater and on an unmodified portion of the insulator material.

3. The method of claim 1, wherein heating the portion of the insulator material includes at least one of:
    a rapid thermal annealing (RTA) process;
    a laser annealing process; and
    a microwave heating process.

4. The method of claim 1, including forming the heater self-aligned with the first conductive element via a masking and etching process.

5. The method of claim 1, wherein forming the first conductive element includes forming a bottom electrode and forming the second conductive element includes forming a top electrode.

6. A method of forming a phase change memory structure, the method comprising:
    forming an insulative adhesion material on a first electrode of a phase change memory cell;
    forming an interfacial heater self-aligned with the first electrode by heating at least a portion of the insulative adhesion material, the interfacial heater being a material different than the insulative adhesion material;
    forming a phase change material on the interfacial heater; and
    forming a second electrode on the phase change material.

7. The method of claim 6, including:
    forming the first electrode such that a side surface of the first electrode is in contact with a dielectric material; and forming the insulative adhesion material on at least a portion of an upper surface of the dielectric material.

8. The method of claim 7, including forming the phase change material on an upper surface of the interfacial heater and on an upper surface of at least a portion of the insulative adhesion material.

9. The method of claim 6, including:
forming the first electrode by depositing an electrode material in a via formed in a dielectric material; and
performing a planarization process on the first electrode prior to forming the insulative adhesion material on the first electrode.

10. The method of claim 6, wherein heating the at least a portion of the insulative adhesion material includes performing a thermal annealing process on the phase change memory structure.

11. The method of claim 6, wherein heating the at least a portion of the insulative adhesion material includes performing a microwave heating process on the at least a portion of the insulative adhesion material.

12. The method of claim 6, wherein heating the at least a portion of the insulative adhesion material includes performing a laser annealing process on the at least a portion of the insulative adhesion material.

13. The method of claim 6, including reducing oxidation of the first electrode by performing an in situ plasma treatment process prior to forming the insulative adhesion material on the first electrode and prior to heating the at least a portion of the insulative adhesion material.

14. A phase change memory structure, comprising:
a bottom electrode having a side surface in contact with a dielectric material;
a phase change material between the bottom electrode and a top electrode;
an insulator material having a first portion providing an adhesive interface for at least a portion of the phase change material, wherein the insulator material has a thickness of less than about 10 nm; and
an interfacial heater self-aligned with the bottom electrode and positioned between the bottom electrode and the phase change material; wherein the interfacial heater is a modified portion of the insulator material and is a material different from the insulator material.

15. The memory structure of claim 14, wherein the first portion of the insulator material is formed on a planarized surface of the dielectric material and the bottom electrode.

16. The memory structure of claim 14, wherein the bottom electrode is formed in a via formed in the dielectric material, and wherein the adhesive interface provided by the first portion of the insulator material includes increased adhesion as compared to adhesion between the phase change material and the dielectric material.

17. The memory structure of claim 14, wherein the bottom electrode is coupled to a metal contact, and wherein the metal contact is coupled to at least one of a source and a drain region of an access transistor corresponding to the phase change memory structure.

18. The memory structure of claim 14, wherein the insulator material is at least one of aluminum nitride (AlN) and silicon nitride (SiN).

19. The memory structure of claim 18, wherein the interfacial heater includes a material from the group including:
titanium aluminum nitride (TiAlN);
titanium silicon nitride (TiSiN); and
tantalum silicon nitride (TaSiN).

20. A phase change memory cell, comprising:
an access device;
a first electrode coupled to the access device via a conductive contact;
an interfacial heater formed on, and self-aligned with, the first electrode;
a phase change material formed on the self-aligned interfacial heater and on at least a portion of an insulator material formed on a dielectric material having a side surface in contact with the first electrode; and
a second electrode formed on the phase change material;
wherein the self-aligned interfacial heater is a portion of the insulator material modified via a heating process such that the self-aligned interfacial heater is a material different from the insulator material.

21. The device of claim 20, wherein the interfacial heater is configured to generate heat to assist with programming of the memory cell.

22. The device of claim 20, wherein the interfacial heater has a thermal conductivity conducive to reducing heat loss to the first electrode.

23. A method of operating a phase change memory cell, the method comprising:
programming the memory cell by providing a voltage difference between a top and bottom electrode of the phase change memory cell; and
providing localized heating to an active region of a phase change material of the memory cell via an interfacial heater formed on, and self-aligned with, the bottom electrode;
wherein the interfacial heater generates heat responsive to the voltage difference which assists with switching of a state of the active region to program the memory cell; and
wherein the interfacial heater is a modified portion of a dielectric material located between the phase change material and the bottom electrode, the modified portion of the dielectric material being modified by at least one of a heating process and a reaction between the dielectric material and a material of the bottom electrode.

24. A method of forming a phase change memory structure, the method comprising:
forming an insulator material on a first conductive element and on a dielectric material of a phase change memory cell;
forming a heater self-aligned with the first conductive element;
forming a phase change material on the heater and at least a portion of the insulator material formed on the dielectric material; and
forming a second conductive element of the phase change memory cell on the phase change material;
wherein forming the heater includes modifying a portion of the insulator material by creating a reaction between the insulator material and a material of the first conductive element;
wherein the insulator material comprises at least one of aluminium nitride and silicon nitride;
wherein the material of the first conductive element comprises at least one of titanium, titanium nitride, and tantalum nitride; and
wherein the reaction forms at least one of a titanium aluminum nitride heater, a titanium silicon nitride heater, and a tantalum silicon nitride heater.

25. A phase change memory structure, comprising:
a bottom electrode having a side surface in contact with a dielectric material;

a phase change material between the bottom electrode and a top electrode;
an insulator material having a first portion providing an adhesive interface for at least a portion of the phase change material; and
an interfacial heater self-aligned with the bottom electrode and positioned between the bottom electrode and the phase change material; wherein the interfacial heater is a modified portion of the insulator material and is a material different from the insulator material, and wherein the self-aligned interfacial heater is formed by a reaction between the insulator material and a material of the bottom electrode.

* * * * *